United States Patent
Sato et al.

(10) Patent No.: US 9,034,687 B2
(45) Date of Patent: May 19, 2015

(54) METHOD OF MANUFACTURING GRAPHENE NANOMESH AND METHOD OF MANUFACTURING SEMICONDUCTOR DEVICE

(71) Applicant: FUJITSU LIMITED, Kawasaki-shi, Kanagawa (JP)

(72) Inventors: Shintaro Sato, Atsugi (JP); Taisuke Iwai, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/164,694

(22) Filed: Jan. 27, 2014

(65) Prior Publication Data

US 2014/0141581 A1    May 22, 2014

Related U.S. Application Data

(63) Continuation of application No. PCT/JP2011/067403, filed on Jul. 29, 2011.

(51) Int. Cl.

| | |
|---|---|
| *H01L 21/00* | (2006.01) |
| *H01L 21/02* | (2006.01) |
| *H01L 29/16* | (2006.01) |
| *H01L 29/66* | (2006.01) |
| *H01L 29/786* | (2006.01) |
| *B82Y 30/00* | (2011.01) |
| *B82Y 40/00* | (2011.01) |

(Continued)

(52) U.S. Cl.
CPC ....... *H01L 21/02664* (2013.01); *C01B 2204/06* (2013.01); *H01L 29/1606* (2013.01); *H01L 29/66742* (2013.01); *H01L 29/78684* (2013.01); *H01L 21/02378* (2013.01); *H01L 21/02527* (2013.01); *H01L 21/0259* (2013.01); *B82Y 30/00* (2013.01); *B82Y 40/00* (2013.01); *C01B 31/0484* (2013.01); *H01L 29/66439* (2013.01); *H01L 29/78696* (2013.01); *H01L 29/778* (2013.01)

(58) Field of Classification Search
None
See application file for complete search history.

(56) References Cited

U.S. PATENT DOCUMENTS

| | | | | |
|---|---|---|---|---|
| 8,048,940 B2 * | 11/2011 | Lukehart et al. | ............. | 523/215 |
| 2010/0200755 A1 | 8/2010 | Kawano et al. | | |

(Continued)

FOREIGN PATENT DOCUMENTS

| | | |
|---|---|---|
| JP | 2006-190729 | 7/2006 |
| JP | 2008-258184 | 10/2008 |

(Continued)

OTHER PUBLICATIONS

Notification of Transmittal of Translation of The International Preliminary Report on Patentability (Form PCT/IB/338, Form PCT/IB/373 & Form PCT/ISA/237), PCT/JP2011/067403, 6 pages, dated Feb. 13, 2014.

(Continued)

*Primary Examiner* — Charles Garber
*Assistant Examiner* — Evren Seven
(74) *Attorney, Agent, or Firm* — Fujitsu Patent Center

(57) ABSTRACT

Particles having a property of absorbing carbon at a particular temperature or higher are deposited on a graphene. The particles are heated to a temperature equal to the particular temperature or higher to make the particles absorb carbon from portions of the graphene under the particles. The particles are removed. Consequently, a graphene nanomesh is obtained.

20 Claims, 8 Drawing Sheets

(51) Int. Cl.
*C01B 31/04* (2006.01)
*H01L 29/778* (2006.01)

(56) References Cited

U.S. PATENT DOCUMENTS

| | | | | |
|---|---|---|---|---|
| 2011/0036829 | A1* | 2/2011 | Fugetsu et al. | 219/541 |
| 2011/0045347 | A1* | 2/2011 | Liu et al. | 429/209 |
| 2011/0174701 | A1* | 7/2011 | Gallaway et al. | 209/606 |
| 2012/0034707 | A1* | 2/2012 | Datta et al. | 436/501 |
| 2012/0156424 | A1* | 6/2012 | Chen et al. | 428/119 |
| 2012/0301953 | A1* | 11/2012 | Duan et al. | 435/287.9 |
| 2013/0048952 | A1* | 2/2013 | Chen et al. | 257/29 |

FOREIGN PATENT DOCUMENTS

| | | | |
|---|---|---|---|
| JP | 2010-109037 | 5/2010 | |
| JP | 2010-206176 | 9/2010 | |
| WO | 2009/149005 | * 12/2009 | C01B 31/00 |

OTHER PUBLICATIONS

Y. Iechika, "Graphene no Kosoku Transistor Oyo eno Chumoku to Kadai", Science & Technology Trends, May 2010, No. 110, pp. 29-42, p. 39, middle column, lines 10 to 21, diagram 10. Partial English translation.

Sato et al., "Graphene Synthesis by Chemical Vapor Deposition and its Application to Transistors", Journal of the Japanese Association of Crystal Growth, vol. 37, No. 3, pp. 48-52, Fig.2. Partial English translation.

K. S. Novoselov, et. al., "Electronic Field Effect in Atomically Thin Carbon Films", Science, 306, 666 (2004). vol. 306 Science www.sciencemag.org, Oct. 22, 2004.

J. Bai, et al., "Graphene Nanomesh", LETTERS published online Feb. 14, 2010. Nature Nanotechnology, vol. 5 | Mar. 2010 | www.nature.com/naturenanotechnology.

D. Kondo et al., "Low-Temperature Synthesis of Graphene and Fabrication of Top-Gated Field Effect Transistors without Using Transfer Process", Applied Physics Express 3 (2010) 025102. The Japan Society of Applied Physics.

X. Liang et al., NANO Letters Formation of Bandgap and Subbands in Graphene Nanomeshes with Sub-10 nm Ribbon Width Fabricated via Nanoimprint Lithography. 2010 American Chemical Society, Nano Lett. 2010, 10. pp. 2454-2460.

Y. Iechika, "Graphene no Kosoku Transistor Oyo eno Chumoku to Kadai", Science & Technology Trends, May 2010, No. 110, pp. 29-42, p. 39, middle column, lines 10 to 21, diagram 10.

Sato et al.,"Graphene Synthesis by Chemical Vapor Deposition and its Application to Transistors", Journal of the Japanese Association of Crystal Growth, vol. 37, No. 3, pp. 48-52, Fig. 2, 2010.

Partial Translation of Written Opinion of International Search Authority, mailed in connection with PCT/JP2011/067403 and mailed Oct. 25, 2011.

International Search Report, mailed in connection with PCT/JP2011/067403 and mailed Oct. 25, 2011 and Partial English Translation Thereof.

* cited by examiner

__US 9,034,687 B2__

METHOD OF MANUFACTURING GRAPHENE NANOMESH AND METHOD OF MANUFACTURING SEMICONDUCTOR DEVICE

CROSS-REFERENCE TO RELATED APPLICATION

This application is a continuation application of International Application No. PCT/JP2011/067403 filed on Jul. 29, 2011 and designated the U.S., the entire contents of which are incorporated herein by reference.

FIELD

The embodiments relate to a method of manufacturing a graphene nanomesh and a method of manufacturing a semiconductor device.

BACKGROUND

In semiconductor devices represented by LSI (large scale integration) using silicon, performance improvement in terms of speed, power consumption, and so on has been achieved by miniaturization. However, in the current situation where a gate length of transistors has reached several ten nanometers, the miniaturization has given rise to adverse effects and does not necessarily lead to the performance improvement. Further, as for the gate length, it is said that about 10 nm is a limit of the physical miniaturization. Under such circumstances, as one technique for improving the performance without depending on the miniaturization, using a material higher than silicon in electric charge mobility as a channel of a transistor has been under consideration.

Examples of such a material are a CNT (Carbon Nano Tube) and a graphene. A graphene is one layer in graphite being a layered crystal and is an ideal two-dimensional material whose carbon (C) atoms are bonded together in a honeycomb shape. A carbon nano tube is a graphene worked into a tubular form. A carbon nano tube and a graphene both have excellent properties, and a graphene has higher affinity to semiconductor processes because of its planar shape. Further, a graphene not only has very high electric charge mobility but also has high thermal conductivity and high mechanical strength.

However, since there is no band gap in a graphene, an on-off ratio cannot be obtained when the graphene is used as a channel as it is. Therefore, several attempts have been proposed to cause a band gap in a graphene. For example, there has been proposed a graphene nanomesh, which has a structure having holes formed cyclically in a graphene. The graphene nanomesh is sometimes called an antidot lattice. Further, as a method of forming a graphene nanomesh, there has been proposed a method which fabricates a nanomesh structure in block copolymer by utilizing a self-assembly phenomenon of the block copolymer and processes a graphene with the nanomesh structure used as a mask.

However, in the graphene nanomesh manufactured by a conventional method, a sufficient band gap cannot be obtained, and even when it is used as a channel, it is difficult to obtain a sufficient on-off ratio.

Non-patent Literature 1: K. S. Novoselov, et al., "Electronic Field Effect in Atomically Thin Carbon Films", Science, 306, 2004, 666

Non-patent Literature 2: J. Bai et al., "Graphene Nanomesh", Nature Nanotech 5, 2010, 190

Non-patent Literature 3: D. Kondo et al., "Low-Temperature Synthesis of Graphene and Fabrication of Top-Gated Field Effect Transistors without Using Transfer Process", Applied Physics Express 3, 2010, 025102

Non-patent Literature 4: X. Liang et al., "Formation of Bandgap and Subbands in Graphene Nanomeshes with Sub-10 nm Ribbon Width Fabricated via Nanoimprint Lithography Graphene Nanomesh", Nano Lett. 10, 2010, 2454

SUMMARY

According to an aspect of the embodiments, in a method of manufacturing a graphene nanomesh, particles having a property of absorbing carbon at a particular temperature or higher are deposited on a graphene, the particles are heated to a temperature equal to the particular temperature or higher to make the particles absorb carbon from portions of the graphene under the particles, and the particles are removed.

According to an aspect of the embodiments, in a method of manufacturing a semiconductor device, a structure in which a source electrode and a drain electrode are provided on both ends of a graphene nanomesh is formed on a substrate, and a gate electrode which controls a potential of the graphene nanomesh between the source electrode and the drain electrode is formed. In the forming the structure, particles having a property of absorbing carbon at a particular temperature or higher are deposited on a graphene which is to be the graphene nanomesh, the particles are heated to a temperature equal to the particular temperature or higher to make the particles absorb carbon from portions of the graphene under the particles, and the particles are removed.

According to an aspect of the embodiments, in a method of manufacturing a photodetector, a structure in which an anode electrode and a cathode electrode are provided on both ends of a graphene nanomesh and a pn junction exists on a portion of the graphene nanomesh between the anode electrode and the cathode electrode is formed on a substrate. In the forming the structure, particles having a property of absorbing carbon at a particular temperature or higher are deposited on a graphene which is to be the graphene nanomesh, the particles are heated to a temperature equal to the particular temperature or higher to make the particles absorb carbon from portions of the graphene under the particles, and the particles are removed.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments will be concretely described with reference to the attached drawings.

(First Embodiment)

Figure 1A:
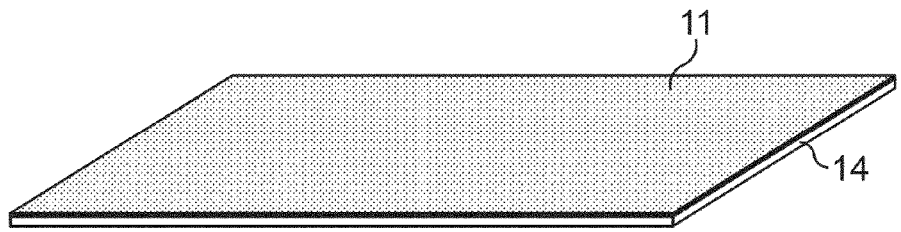
FIG. 1A is a view illustrating a method of manufacturing a graphene nanomesh according to a first embodiment.
Figure 1B:
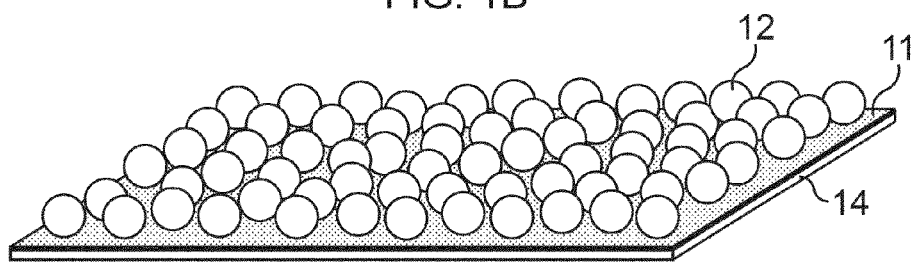
FIG. 1B is a view illustrating the method of manufacturing the graphene nanomesh subsequent to FIG. 1A.
Figure 1C:
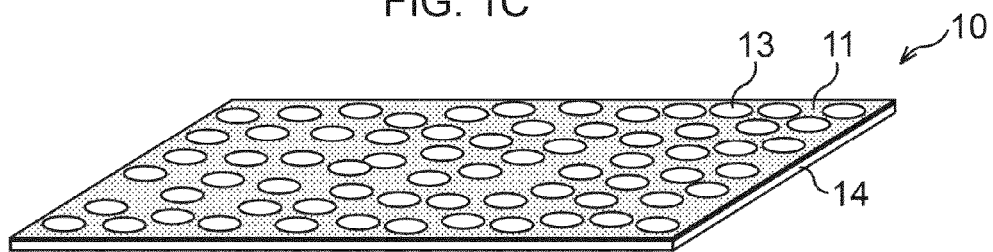
FIG. 1C is a view illustrating the method of manufacturing the graphene nanomesh subsequent to FIG. 1B.

First, a first embodiment will be described. FIG. 1A to FIG. 1C are views illustrating a method of manufacturing a graphene nanomesh according to the first embodiment in order of steps.

Figure 1D:
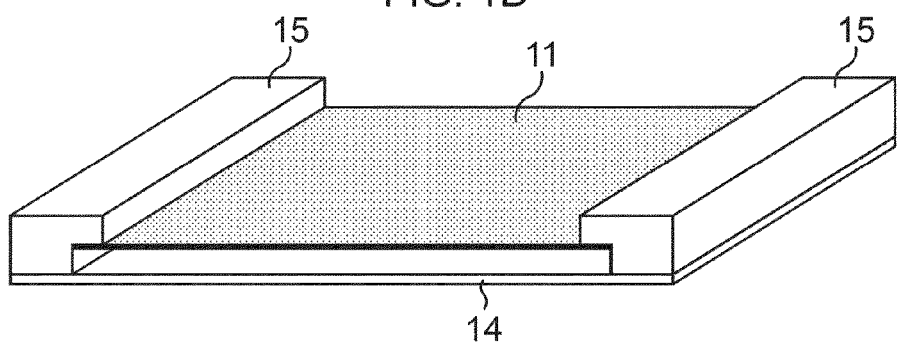
FIG. 1D is a view illustrating another example of a relation between a graphene and a substrate.

First, as illustrated in FIG. 1A, a graphene 11 is prepared on a substrate 14. For example, the graphene 11 peeled off from a graphite crystal by an adhesive tape is affixed on the substrate 14. Alternatively, with a SiC substrate used as the substrate 14, the graphene 11 may be formed on a surface of the substrate 14 by annealing the substrate 14. Alternatively, a graphene synthesized by a CVD (chemical vapor deposition) method may be used. Note that the graphene 11 need not be in contact with the substrate 14, and for example, as illustrated in FIG. 1D, space may exist between the graphene 11 and the substrate 14, with the graphene 11 being suspended by support members 15 provided on the substrate 14.

Then, as illustrated in FIG. 1B, particles 12 having a property of absorbing carbon at a particular temperature or higher are deposited on the graphene 11. Examples of a material of the particles 12 are Ni, Co, Fe, Cu, Ru, Ti, Ta, Mo, Pt, Pd, W, Re, V, and the like. An alloy of these metals may be used. The particles 12 may contain Ni, Co, Fe, Cu, Ru, Ti, Ta, Mo, Pt, Pd, W, Re, or V, or any combination thereof. Further, among them, elemental metals of Ni, Co, and Fe or alloys thereof are especially preferable. They may be used as a catalyst during the formation of a carbon nano tube and the like. A size of the particles 12 is preferably decided according to a size of holes of the graphene nanomesh that is to be manufactured, and is set to, for example, about 0.5 nm to 100 nm.

Figure 2:
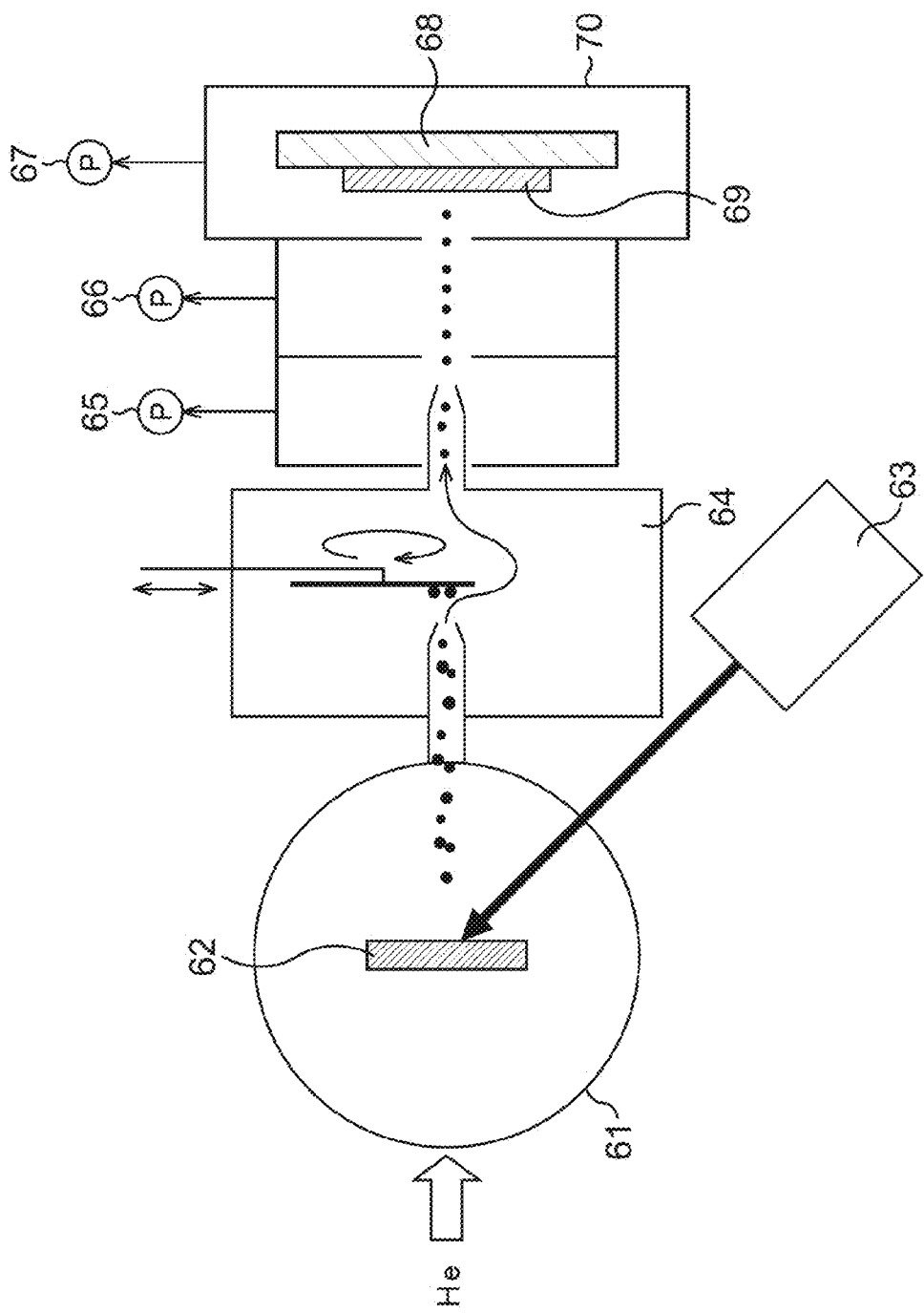
FIG. 2 is a view illustrating an example of an apparatus used for depositing particles.

Here, an example of a method of depositing the particles 12 will be described. FIG. 2 is a view illustrating an example of an apparatus used for depositing the particles 12. The method using the apparatus generates nanoparticles by laser ablation in low-pressure He gas. Concretely, 1.9 SLM (standard liter per minute) He gas is led to a generation chamber 61 and a pressure in the generation chamber 61 is adjusted to about 1 kPa. Then, a metal target 62, for example, a Co target, installed in the generation chamber 61 is irradiated with a pulsed laser 63. Here, as the pulsed laser 63, one having a second harmonic (532 nm) of a YAG (Yttrium Aluminum Garnet) laser is used, for example, and its power is set to 2 W and a repetition frequency of the pulse is set to 20 Hz. As a result of the laser radiation, metal vapor is generated from the metal target 62, and once the metal vapor is rapidly cooled by the He gas, particles with an about 1 nm to 100 nm particle size are formed. The particles with an about 1 nm to 100 nm particle size are called nanoparticles. Then, the particles are sent to a fine particle size sorting unit (impactor) 64 by the He gas.

Figure 3A:
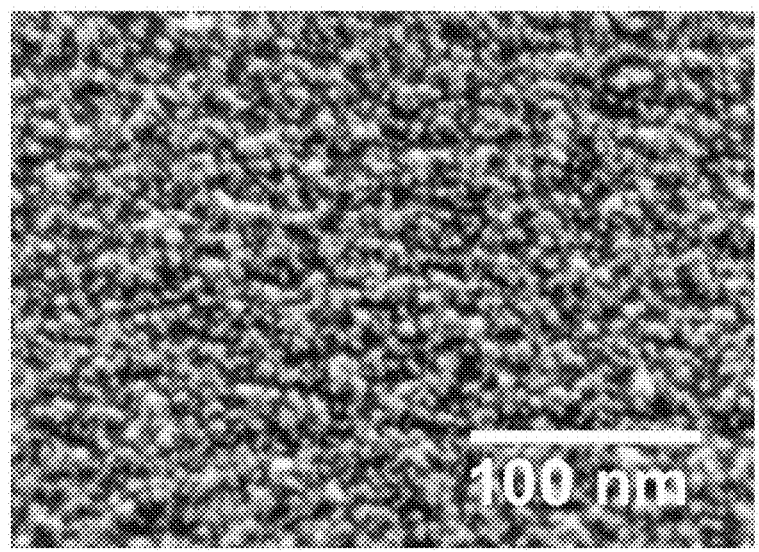
FIG. 3A is a view illustrating an example of a scanning electron microscope image of nanoparticles deposited on a substrate.
Figure 3B:
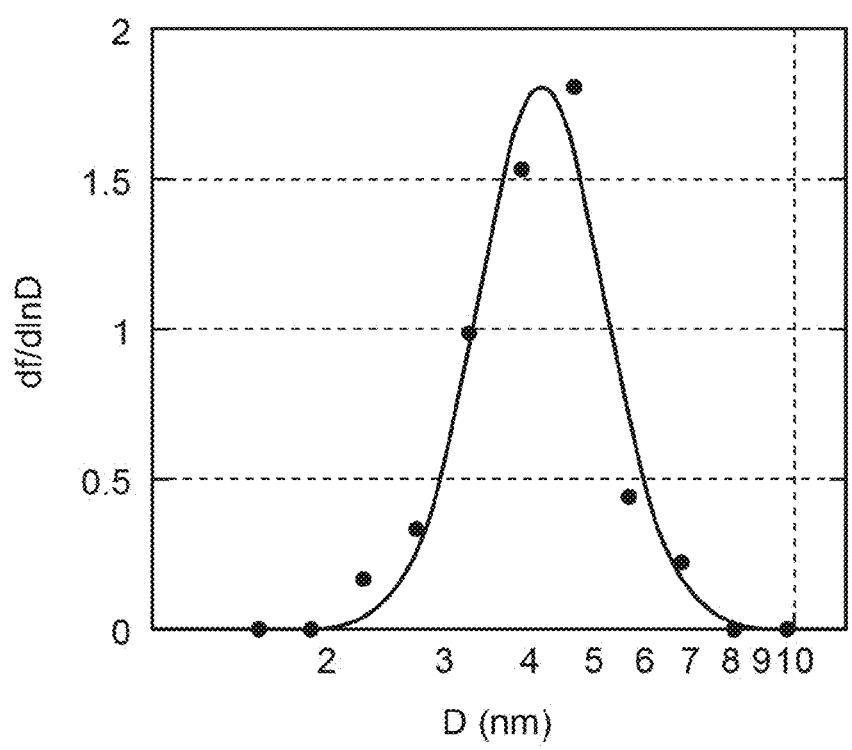
FIG. 3B is a chart representing distribution of diameter of nanoparticles.

The impactor 64 is an apparatus to remove particles with a particular size or more by inertia of the particles. Since the nanoparticles generally grow with time due to aggregation or the like, there is a lower limit to the size of the nanoparticles. Therefore, by removing the nanoparticles having a particular size or more with the impactor 64, the size of the nanoparticles passing through the impactor 64 is controlled. Here, the impactor 64 is used under a condition under which a diameter of the nanoparticles passing through the impactor 64 is about 4 nm, for example. The nanoparticles selected according to the size by the impactor 64 are thereafter led to a deposition chamber 70 with an about $10^{-3}$ Pa pressure to which a pump 67 is connected, by differential pumping using pumps 65 and 66. The nanoparticles in the course of being led to the deposition chamber 70 come to have a beam shape and collide substantially perpendicularly with a substrate 69 placed on a stage 68 to be deposited. In this method, the particles 12 are not arranged in closest packing but are arranged at random. FIG. 3A illustrates an example of a scanning electron microscope image of nanoparticles deposited on a substrate, and FIG. 3B represents distribution of a diameter D of the nanoparticles.

Figure 4A:
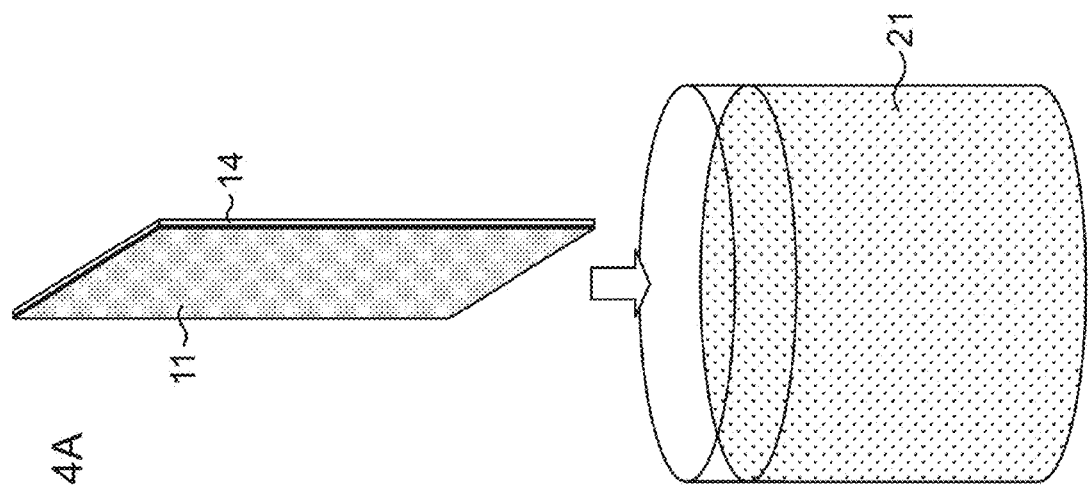
FIG. 4A is a view illustrating a method of depositing particles.
Figure 4B:
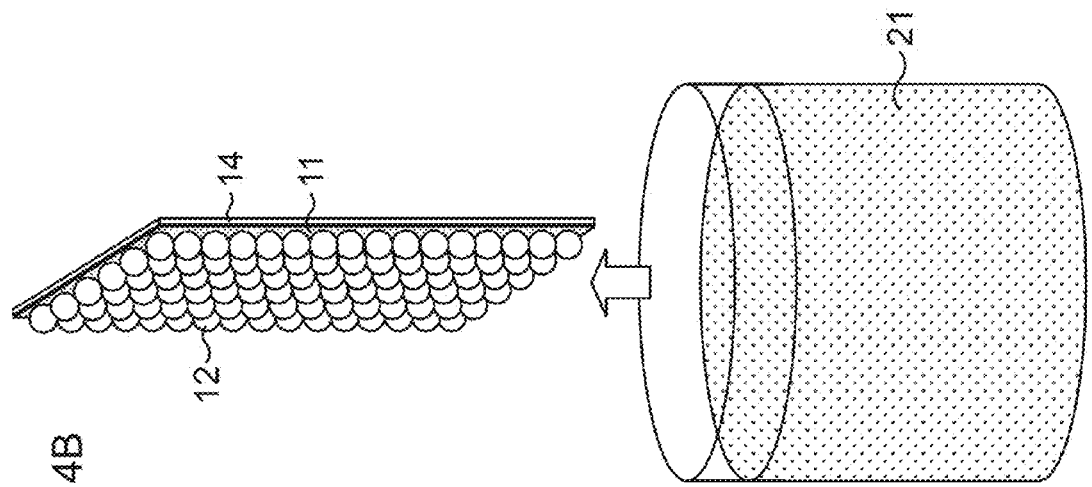
FIG. 4B is a view illustrating the method of depositing the particles subsequent to FIG. 4B.

The aforesaid method is what is called a dry method, but the particles 12 may be deposited on the graphene 11 by a liquid phase method. In the liquid phase method, for example, as illustrated in FIG. 4A, the graphene 11 and the substrate 14 are immersed in a suspension 21 in which the particles 12 are dispersed, and then, as illustrated in FIG. 4B, the graphene 11 and the substrate 14 are taken up from the suspension 21.

Incidentally, when the dry method and the liquid phase method are compared, the dry method more suppresses contamination occurring in the graphene 11 during the deposition of the particles 12. Therefore, the dry method is preferably used.

After the particles 12 are deposited on the graphene 11, the particles 12 are heated to a temperature equal to a temperature at which the particles 12 absorb carbon or higher in an annealing furnace or the like, for example, to make the particles 12 absorb carbon from portions of the graphene 11 under the particles 12. As a result, holes 13 are formed in the portions of the graphene 11, from which the carbon has been absorbed, as illustrated in FIG. 1C. The temperature at which the particles 12 absorb carbon differs depending on its material, and is 300° C. or higher in many materials. Further, when the temperature of the particles 12 is higher than 700° C., the particles 12 sometimes diffuse on a surface of the graphene 11. Therefore, the temperature to which the particles 12 are heated is preferably 300° C. to 700° C. When Co is used as a material of the particles 12, the heating temperature is set to about 400° C. to 500° C., for example. Further, the heating time period can be decided according to the material and size of the particles 12 and the size of the holes 13 that are to be formed, and is set to about 30 minutes, for example. Up to a certain time period, as the heating time is longer, the holes 13 is larger. However, since there is an upper limit to an amount of the carbon that the particles 12 can absorb, heating longer than the certain time period does not easily cause the holes 13 to be larger. Therefore, using the particles 12 whose material and size are appropriate makes it possible to stably obtain the holes 13 with a particular size without strictly controlling the heating time. A heating atmosphere is not particularly limited, and for example, is an atmosphere of mixed gas of argon and hydrogen, and a pressure in the annealing furnace is set to about 1 kPa.

Then, as illustrated in FIG. 1C, the particles 12, which have absorbed the carbon, are removed. In removing the particles 12, the particles 12 and so on are immersed in, for example, an acid solution such as a dilute hydrochloric acid or iron chloride water solution, whereby the particles 12 are dissolved. The immersing time is set to about one minute, for example. As a result, a graphene nanomesh 10 having the holes 13 formed in the graphene 11 is obtained.

According to the method of the embodiment, it is possible to stably form the minute holes 13, which accordingly makes it possible to stably make a width of a neck of the graphene nanomesh 10 minute. The narrower a width of a neck of a graphene nanomesh, the larger its band gap, and therefore, it is possible to stably obtain a wide band gap. According to the non-patent document 4, a band gap Eg of a graphene nanomesh exhibits dependency such that it is in inverse proportion to a width W (nm) of a neck (Eg≈0.95/W (eV)). While a neck width obtained by the conventional method is about 7 nm at the minimum, the method of the embodiment can achieve a neck width equal to 5 nm or less. As a result, a wide band gap is obtained, which makes it possible to obtain a large on-off ratio. Further, controlling the size and density of the particles 12 can control a width of the band gap.

Incidentally, when the holes 13 are extremely large as compared with the width of the neck, it sometimes is impossible to pass a large current. Therefore, the size of the holes 13 and the width of the neck are preferably about equal. For example, the width of the neck is preferably within a range of ±20% of the size of the holes 13.

When the particles 12 are deposited on the graphene 11 by the dry method, the particles 12 are arranged disorderly as described above, and the formed holes 13 are also arranged disorderly, which causes variation in the width of the neck. Therefore, it is difficult to measure the width of the neck. However, the band gap in such a case is about equal to a band gap when it is assumed that the holes 13 with the same size are orderly arranged on the graphene nanomesh 10 with the same density. Therefore, even when the holes 13 are arranged disorderly, the width of the neck at this time can be regarded as being equal to the width of the neck when it is assumed that the holes 13 with the same size are orderly arranged on the graphene nanomesh 10 with the same density.

(Second Embodiment)

Next, a second embodiment will be described. In the second embodiment, a method of etching the particles 12 which have absorbed the carbon is different from that of the first embodiment. Specifically, in the second embodiment, after the particles 12 are made to absorb the carbon, the annealing furnace is exhausted to vacuum, thereafter is further heated to make the particles 12 evaporate, and is decreased in temperature. The other structure is the same as that of the first embodiment. Note that in the further heating, the heating is performed for about five seconds up to about 1100° C., for example. Further, the temperature is decreased instantaneously after the evaporation of the particles 12, for example.

According to such a second embodiment, it is possible to remove the particles 12 by a dry process. In the case where the particles 12 are removed by a wet process as in the first embodiment, there is a possibility that the graphene 11 is damaged in the process, but according to the second embodiment, it is possible to greatly reduce the possibility. Further, even if a residue exists after the dry process and a wet process is performed for removing the residue, it is possible to greatly shorten the time period taken for the removal, resulting in little damage to the graphene 11.

(Third Embodiment)

Next, a third embodiment will be described. FIG. 5A to FIG. 5D are views illustrating a method of manufacturing a semiconductor device according to the third embodiment in order of steps.

Figure 5A:
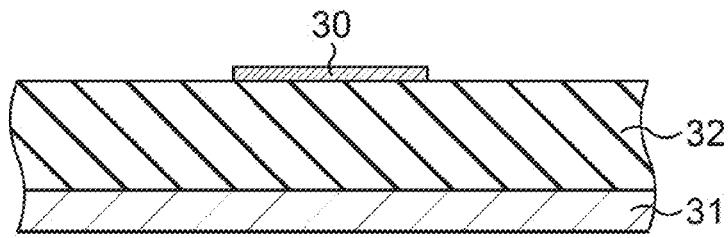
FIG. 5A is a view illustrating a method of manufacturing a semiconductor device according to a third embodiment.

First, as illustrated in FIG. 5A, a graphene nanomesh 30 having a shape of a channel is disposed on an insulation film 32 provided on a substrate 31. In disposing the graphene nanomesh 30, the graphene nanomesh 30 worked into the shape of the channel may be disposed on the insulation film 32, or after a graphene nanomesh larger than the channel is formed, it may be worked into the shape of the channel. In either case, the graphene nanomesh may be formed by the method of the first or second embodiment.

Figure 5B:
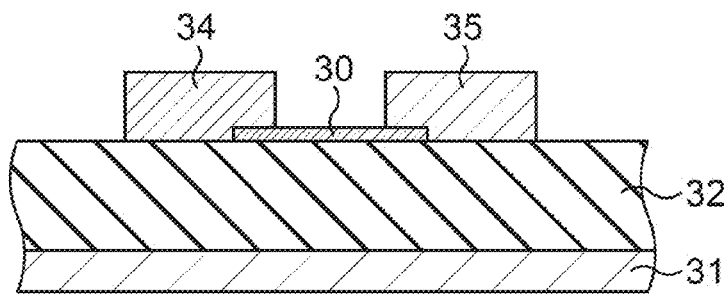
FIG. 5B is a view illustrating the method of manufacturing the semiconductor device subsequent to FIG. 5A.

Then, as illustrated in FIG. 5B, a source electrode 34 and a drain electrode 35 are formed on both ends of the graphene nanomesh 30. The source electrode 34 and the drain electrode 35 each include, for example, a Ti film with an about 10 nm thickness and an Au film with an about 50 nm thickness formed on the Ti film. The source electrode 34 and the drain electrode 35 may be formed by, for example, a lift-off method. In this case, a resist mask from which a region where to form the source electrode 34 and a region where to form the drain electrode 35 are exposed is formed by using photolithography or electron beam lithography, an electrode material is vacuum-deposited, and the resist mask is removed together with the electrode material thereon.

Figure 5C:
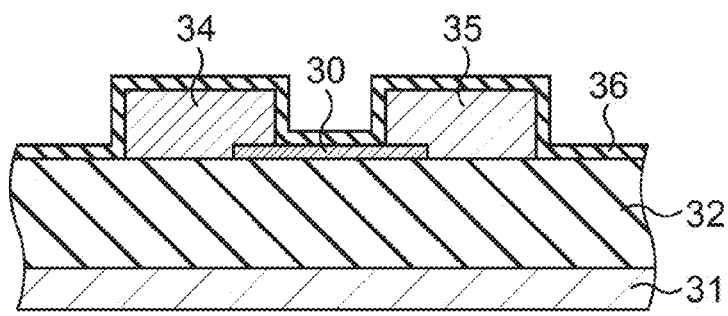
FIG. 5C is a view illustrating the method of manufacturing the semiconductor device subsequent to FIG. 5B.

Thereafter, as illustrated in FIG. 5C, a gate insulation film 36 covering the graphene nanomesh 30, the source electrode 34, and the drain electrode 35 is formed. In the formation of the gate insulation film 36, for example, an Al film with an about 2 nm thickness is deposited by a vapor deposition method, the Al film is oxidized, and subsequently, an alumina film with an about 10 nm thickness is deposited by an ALD (atomic layer deposition) method.

Figure 5D:
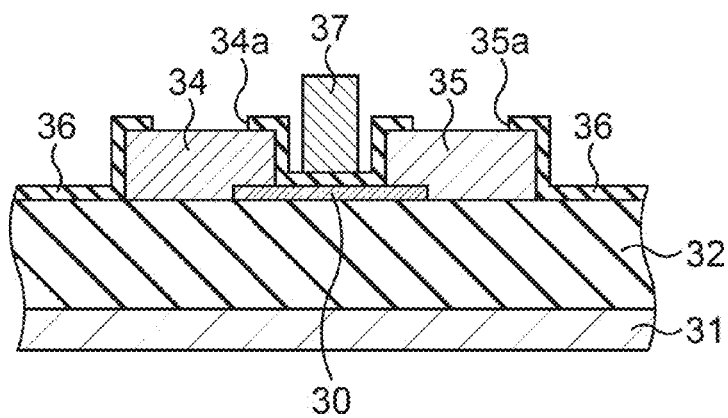
FIG. 5D is a view illustrating the method of manufacturing the semiconductor device subsequent to FIG. 5C.

Then, as illustrated in FIG. 5D, a gate electrode 37, which controls a potential of the graphene nanomesh 30 between the source electrode 34 and the drain electrode 35, is formed on the gate insulation film 36. The gate electrode 37 includes, for example, a Ti film with an about 10 nm thickness and an Au film with an about 50 nm thickness formed on the Ti film. The gate electrode 37 may be formed also by, for example, a lift-off method. Further, an opening portion 34a from which part of the source electrode 34 is exposed and an opening portion 35a from which part of the drain electrode 35 is exposed are formed in the gate insulation film 36. In this manner, a top-gated field-effect transistor where the graphene nanomesh 30 works as the channel is obtained.

Note that the materials of the source electrode 34, the drain electrode 35, and the gate electrode 37 are not limited to the aforesaid Au and Ti. For example, a stack of a Cr film and an Au film thereon, a Ni film, a Co film, a Pt film, a Pd film, a Si film, and the like are usable. Further, the material of the gate insulation film 36 is not limited to the above-described one, and an $HfO_2$ film, an $SiO_2$ film, and the like are usable.

(Fourth Embodiment)

Figure 6A:
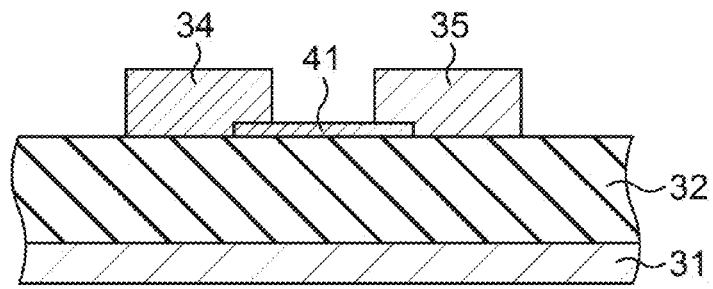
FIG. 6A is a view illustrating a method of manufacturing a semiconductor device according to a fourth embodiment.
Figure 6B:
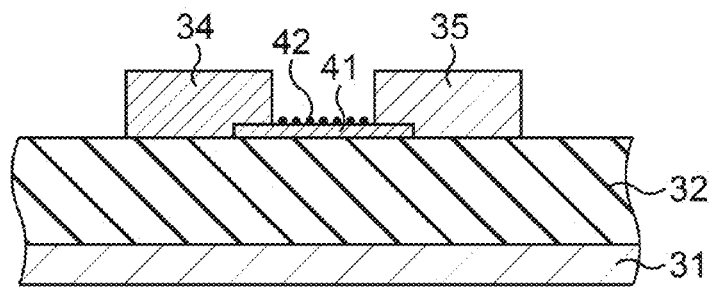
FIG. 6B is a view illustrating the method of manufacturing the semiconductor device subsequent to FIG. 6A.
Figure 6C:
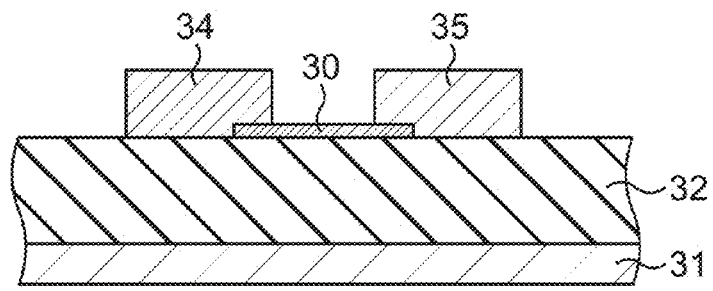
FIG. 6C is a view illustrating the method of manufacturing the semiconductor device subsequent to FIG. 6B.

Next, a fourth embodiment will be described. FIG. 6A to FIG. 6C are views illustrating a method of manufacturing a semiconductor device according to the fourth embodiment in order of steps.

First, as illustrated in FIG. 6A, a graphene 41 having a shape of a channel is disposed on an insulation film 32 provided on a substrate 31. In disposing the graphene 41, the graphene 41 worked into a shape of a channel may be disposed on the insulation film 32, or after a graphene larger than the channel is formed, it may be worked into the shape of channel. Then, a source electrode 34 and a drain electrode 35 are formed on both ends of the graphene 41 in the same manner as in the third embodiment.

Thereafter, as illustrated in FIG. 6B, particles 42 are deposited on the graphene 41. As the particles 42, the same ones as the particles 12 in the first embodiment are used.

Subsequently, the particles 42 and so on are heated, whereby the particles 42 are made to absorb carbon from portions of the graphene 41 right under the particles 42. Then, the particles 42, which have absorbed the carbon, are removed. As a result, as illustrated in FIG. 6C, a graphene nanomesh 30 in which holes are provided is obtained.

Thereafter, processes from the formation of a gate insulating film 36 are performed as in the third embodiment (refer to FIG. 5C and FIG. 5D), to complete a semiconductor device.

In the third embodiment, there is a concern that the graphene nanomesh 30 may be damaged when the source electrode 34 and the drain electrode 35 are formed, but according to the fourth embodiment described above, such a concern can be eliminated. This is because the source electrode 34 and the drain electrode 35 are formed before the graphene nanomesh 30 is obtained.

Figure 7:
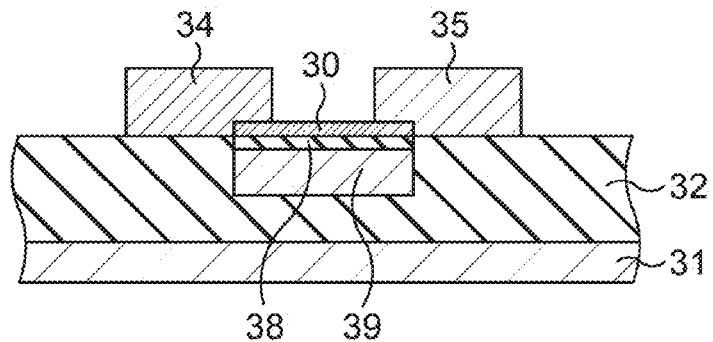
FIG. 7 is a view illustrating a modification example of the third embodiment and the fourth embodiment.

Incidentally, as a modification example of the third embodiment and the fourth embodiment, a back-gated field-effect transistor including a gate electrode 39 buried in an insulation film 32 and a gate insulation film 38 on the gate electrode 39 may be manufactured as illustrated in FIG. 7. In this case, it is possible to prevent damage to the graphene nanomesh 30 accompanying the formation of the gate electrode 39 and the formation of the gate insulation film 38. This is because the gate electrode 39 and the gate insulation film 38 are formed before the graphene nanomesh 30 is obtained.

(Fifth Embodiment)

Next, a fifth embodiment will be described. FIG. 8A to FIG. 8E are views illustrating a method of manufacturing a semiconductor device according to the fifth embodiment in order of steps.

Figure 8A:
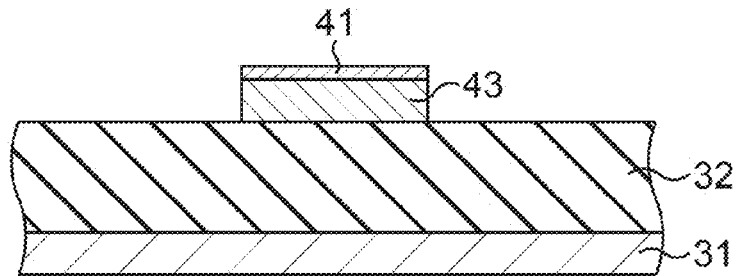
FIG. 8A is a view illustrating a method of manufacturing a semiconductor device according to a fifth embodiment.

First, as illustrated in FIG. 8A, a metal film 43 having a same planar shape as a shape of a channel is formed on an insulation film 32 provided on a substrate 31, and a graphene 41 is formed thereon by a CVD method. As the metal film 43, one that functions as a catalyst for formation of the graphene 41 is formed.

Figure 8B:
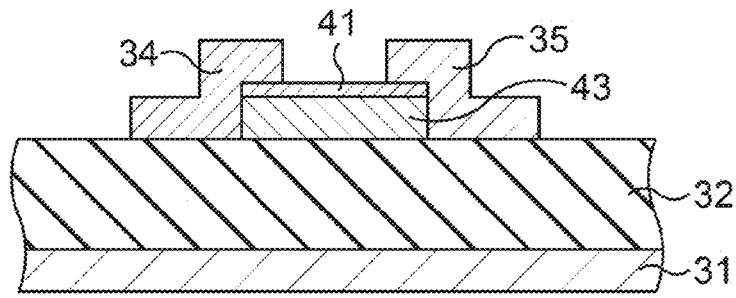
FIG. 8B is a view illustrating the method of manufacturing the semiconductor device subsequent to FIG. 8A.

Then, as illustrated in FIG. 8B, a source electrode 34 and a drain electrode 35 are formed so as to surround the metal film 43 and the graphene 41 from above and from sides on both ends of the metal film 43 and the graphene 41.

Figure 8C:
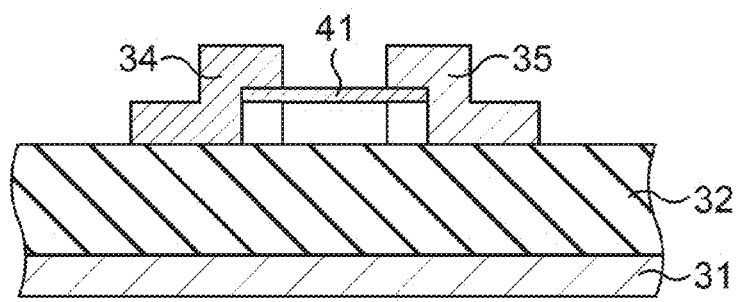
FIG. 8C is a view illustrating the method of manufacturing the semiconductor device subsequent to FIG. 8B.

Thereafter, as illustrated in FIG. 8C, the metal film 43 is removed by wet etching while the source electrode 34, the drain electrode 35, and the graphene 41 are left. For this process, as a material of the metal film 43, one that is more easily dissolved than the source electrode 34 and the drain electrode 35 in the wet etching using a particular solution, for example, hydrochloric acid, is used, for example, used is Fe, Co, Ni, Cu, or the like. The form illustrated in FIG. 1D may be obtained by such a process.

Figure 8D:
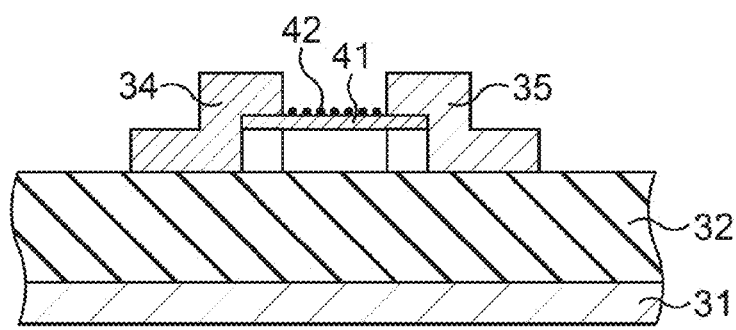
FIG. 8D is a view illustrating the method of manufacturing the semiconductor device subsequent to FIG. 8C.
Figure 8E:
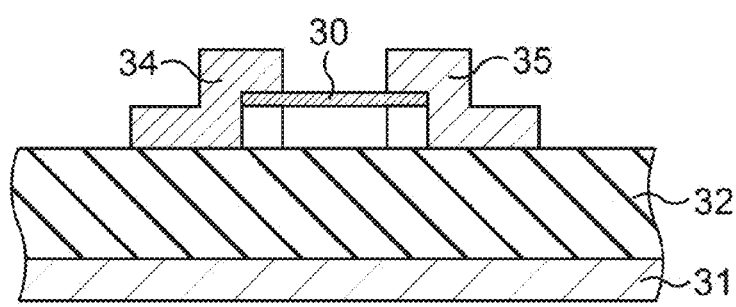
FIG. 8E is a view illustrating the method of manufacturing the semiconductor device subsequent to FIG. 8D.

After the metal film 43 is removed, particles 42 are deposited on the graphene 41 as illustrated in FIG. 8D. Subsequently, the particles 42 and so on are heated, whereby the particles 42 are made to absorb carbon from portions of the graphene 41 right under the particles 42. Then, the particles 42 having absorbed the carbon are removed. As a result, a graphene nanomesh 30 in which holes are provided is obtained, as illustrated in FIG. 8E.

Thereafter, processes from the formation of a gate insulation film 36 are performed in the same manner as in the third embodiment (refer to FIG. 5C and FIG. 5D), to complete a semiconductor device.

(Sixth Embodiment)

Figure 9A:
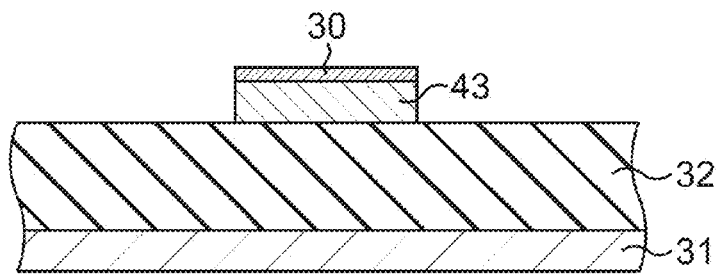
FIG. 9A is a view illustrating a method of manufacturing a semiconductor device according to a sixth embodiment.
Figure 9B:
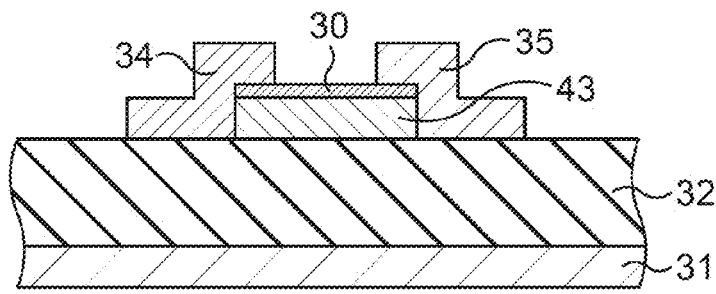
FIG. 9B is a view illustrating the method of manufacturing the semiconductor device subsequent to FIG. 9A.
Figure 9C:
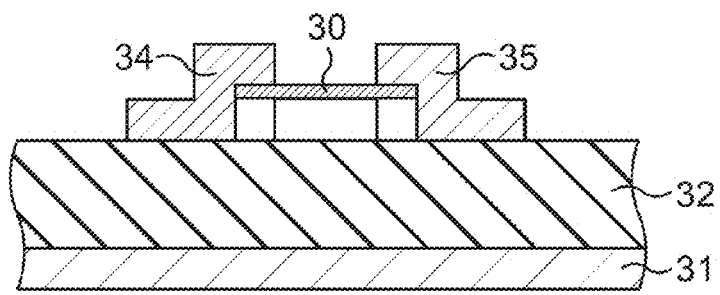
FIG. 9C is a view illustrating the method of manufacturing the semiconductor device subsequent to FIG. 9B.

Next, a sixth embodiment will be described. FIG. 9A to FIG. 9C are views illustrating a method of manufacturing a semiconductor device according to the sixth embodiment in order of steps.

First, as illustrated in FIG. 9A, a metal film 43 having a same planar shape as a shape of a channel is formed on an insulation film 32 provided on a substrate 31, and a graphene nanomesh 30 is disposed thereon. In disposing the graphene nanomesh 30, for example, a graphene is formed by a CVD method, the same particles as the particles 12 are deposited thereon, the particles are made to absorb part of carbon from the graphene by heating, and the particles are removed.

Then, as illustrated in FIG. 9B, a source electrode 34 and a drain electrode 35 are formed so as to surround the metal film 43 and the graphene nanomesh 30 from above and from sides on both ends of the metal film 43 and the graphene nanomesh 30.

Thereafter, as illustrated in FIG. 9C, the metal film 43 is removed by wet etching while the source electrode 34, the drain electrode 35, and the graphene nanomesh 30 are left.

Thereafter, processes from the formation of a gate insulation film 36 are performed in the same manner as in the third embodiment (refer to FIG. 5C and FIG. 5D), to complete a semiconductor device.

(Seventh Embodiment)

Figure 10:
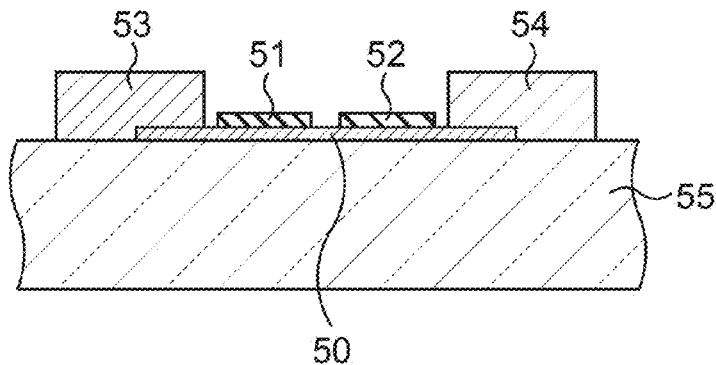
FIG. 10 is a view illustrating a method of manufacturing a semiconductor device according to a seventh embodiment.

Next, a seventh embodiment will be described. FIG. 10 is a view illustrating a method of manufacturing a semiconductor device according to the seventh embodiment. In the seventh embodiment, a photodetector is manufactured.

First, as illustrated in FIG. 10, a graphene nanomesh 50 having a shape of a light receiving part is disposed on a transparent substrate 55. In disposing the graphene nanomesh 50, the graphene nanomesh 50 worked into the shape of the light receiving part may be disposed on the transparent substrate 55, or after a graphene nanomesh larger than the light receiving part is formed, it may be worked into the shape of the light receiving part. In either case, the graphene nanomesh is formed by the method of the first or second embodiment.

Then, an anode electrode 53 and a cathode electrode 54 are formed on both ends of the graphene nanomesh 50, and between them, an $Al_2O_3$ film 51 and an $HfO_2$ film 52 are formed on the graphene nanomesh 50. At this time, the $Al_2O_3$ film 51 is located closer to the anode electrode 53 than the $HfO_2$ film 52.

A portion of the graphene nanomesh 50 under the $Al_2O_3$ film 51 functions as a p-type semiconductor and a portion of the graphene nanomesh 50 under the $HfO_2$ film functions as an n-type semiconductor. Therefore, a pn junction exists on the graphene nanomesh 50. Thus, when the graphene nanomesh 50 is irradiated with light via the transparent substrate 55, a photoelectromotive force is generated.

It should be noted that the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

According to the methods of manufacturing the graphene nanomesh and so on, it is possible to obtain a channel material having a sufficient band gap.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the methods of manufacturing the graphene nanomesh and so on, it is possible to obtain a sufficient band gap by a simple method.

What is claimed is:

1. A method of manufacturing a graphene nanomesh, comprising:
    depositing particles having a property of absorbing carbon at a particular temperature or higher on a graphene layer;
    heating the particles to a temperature equal to the particular temperature or higher to make the particles absorb carbon from portions of the graphene layer under the particles with keeping the particles at their deposited positions; and
    removing the particles.

2. The method of manufacturing the graphene nanomesh according to claim 1, wherein the particles contain Ni, Co, Fe, Cu, Ru, Ti, Ta, Mo, Pt, Pd, W, Re, or V, or any combination thereof.

3. The method of manufacturing the graphene nanomesh according to claim 1, wherein a diameter of the particles is 0.5 nm to 100 nm.

4. The method of manufacturing the graphene nanomesh according to claim 1, wherein the removing the particles comprises dissolving the particles in an acid solution.

5. The method of manufacturing the graphene nanomesh according to claim 1, wherein the removing the particles comprises evaporating the particles by heating the particles.

6. The method of manufacturing the graphene nanomesh according to claim 1, wherein the particles are deposited on the graphene by a dry method.

7. The method of manufacturing the graphene nanomesh according to claim 1, wherein the particles are heated to a temperature equal to 700° C. or lower while making the particles absorb carbon.

8. The method of manufacturing the graphene nanomesh according to claim 1, wherein a width of a neck is within a range of −20% to +20% of a size of holes formed by the removing the particles.

9. A method of manufacturing a semiconductor device, comprising:
    forming a structure in which a source electrode and a drain electrode are provided on both ends of a graphene nanomesh on a substrate; and
    forming a gate electrode which controls a potential of the graphene nanomesh between the source electrode and the drain electrode, wherein
    the forming the structure comprises:
    depositing particles having a property of absorbing carbon at a particular temperature or higher on a graphene layer which is to be the graphene nanomesh;
    heating the particles to a temperature equal to the particular temperature or higher to make the particles absorb carbon from portions of the graphene layer under the particles with keeping the particles at their deposited positions; and
    removing the particles.

10. The method of manufacturing the semiconductor device according to claim 9, wherein the forming the structure comprises forming the source electrode and the drain electrode after the removing the particles.

11. The method of manufacturing the semiconductor device according to claim 9, wherein the forming the structure comprises forming the source electrode and the drain electrode on both ends of the graphene layer before the depositing the particles.

12. The method of manufacturing the semiconductor device according to claim 9, wherein as the structure, a structure having a space between the graphene nanomesh and the substrate is formed.

13. The method of manufacturing the semiconductor device according to claim 9, wherein the particles contain Ni, Co, Fe, Cu, Ru, Ti, Ta, Mo, Pt, Pd, W, Re, or V, or any combination thereof.

14. The method of manufacturing the semiconductor device according to claim 9, wherein a diameter of the particles is 0.5 nm to 100 nm.

15. The method of manufacturing the semiconductor device according to claim 9, wherein the removing the particles comprises dissolving the particles in an acid solution.

16. The method of manufacturing the semiconductor device according to claim 9, wherein the removing the particles comprises evaporating the particles by heating the particles.

17. The method of manufacturing the semiconductor device according to claim 9, wherein the particles are deposited on the graphene layer by a dry method.

18. The method of manufacturing the semiconductor device according to claim 9, wherein the particles are heated to a temperature equal to 700° C. or lower while making the particles absorb carbon.

19. The method of manufacturing the semiconductor device according to claim 9, wherein a width of a neck is within a range of −20% to +20% of a size of holes formed by the removing the particles.

20. A method of manufacturing a photodetector, comprising
    forming a structure in which an anode electrode and a cathode electrode are provided on both ends of a graphene nanomesh and a pn junction exists on a portion of the graphene nanomesh between the anode electrode and the cathode electrode on a substrate, wherein the forming the structure comprises:

depositing particles having a property of absorbing carbon at a particular temperature or higher on a graphene layer which is to be the graphene nanomesh;

heating the particles to a temperature equal to the particular temperature or higher to make the particles absorb carbon from portions of the graphene layer under the particles with keeping the particles at their deposited positions; and removing the particles.

* * * * *